(12) United States Patent
Yeh et al.

(10) Patent No.: US 12,568,807 B2
(45) Date of Patent: Mar. 3, 2026

(54) INTERCONNECT STRUCTURE FOR SEMICONDUCTOR DEVICE AND RELATED METHODS

(71) Applicant: Taiwan Semiconductor Manufacturing Company Ltd., Hsinchu (TW)

(72) Inventors: Yu-Shan Yeh, Hsinchu (TW); Neng-Jye Yang, Hsinchu (TW); Kuo-Bin Huang, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 679 days.

(21) Appl. No.: 17/894,575

(22) Filed: Aug. 24, 2022

(65) Prior Publication Data

US 2024/0071820 A1 Feb. 29, 2024

(51) Int. Cl.
*H01L 21/768* (2006.01)
*H01L 21/02* (2006.01)
(52) U.S. Cl.
CPC .... *H01L 21/76832* (2013.01); *H01L 21/0228* (2013.01); *H01L 21/76831* (2013.01)
(58) Field of Classification Search
CPC ........... H01L 21/76832; H01L 21/0228; H01L 21/76831
See application file for complete search history.

(56) References Cited

U.S. PATENT DOCUMENTS

| | | | |
|---|---|---|---|
| 2005/0167742 A1* | 8/2005 | Challa ................. | H10D 84/143 |
| | | | 257/E29.264 |
| 2017/0148868 A1 | 5/2017 | Lindert et al. | |
| 2018/0006141 A1* | 1/2018 | Fronheiser ........... | H01L 21/285 |
| 2019/0122982 A1* | 4/2019 | Hourani ............. | H01L 23/5226 |
| 2020/0219931 A1* | 7/2020 | Amanapu ............. | H10B 61/00 |

(Continued)

FOREIGN PATENT DOCUMENTS

| | | |
|---|---|---|
| CN | 104733371 A | 6/2015 |
| CN | 110211924 A | 9/2019 |
| CN | 114823494 A | 7/2022 |

(Continued)

OTHER PUBLICATIONS

IP.com search history (Year: 2025).*

(Continued)

*Primary Examiner* — Zandra V Smith
*Assistant Examiner* — Andre C Stevenson
(74) *Attorney, Agent, or Firm* — Foley & Lardner LLP

(57) ABSTRACT

An interconnect structure, which may be used for example in a semiconductor device, is disclosed. The interconnect structure includes a contact layer made of a metal; one or more dielectric layers on the contact layer, and a deposited layer made of an insulating material. The interconnect structure further includes a trench through the one or more dielectric layers so that a sidewall surface of the trench is formed by the one or more dielectric layers and a bottom surface of the trench is formed by a portion of the contact layer. The deposited layer is in the trench and a thickness of the insulating material on the sidewall surface of the trench is at least 2.1 times greater than a thickness of the insulating material on the bottom surface of the trench.

20 Claims, 25 Drawing Sheets

(56) References Cited

U.S. PATENT DOCUMENTS

2023/0395681 A1 * 12/2023 Liu ..................... H10D 62/121

FOREIGN PATENT DOCUMENTS

| TW | 201913935 A | 4/2019 |
| TW | 202209492 A | 3/2022 |

OTHER PUBLICATIONS

Taiwan Office Action issued in connection with TW Appl. No. 112130869 dated Apr. 23, 2025.
Taiwan Office Action issued in connection with TW Appl. No. 112130869 dated Sep. 23, 2024.
Taiwan Office Action issued in connection with TW Appl. No. 112130869 dated Oct. 15, 2025.

* cited by examiner

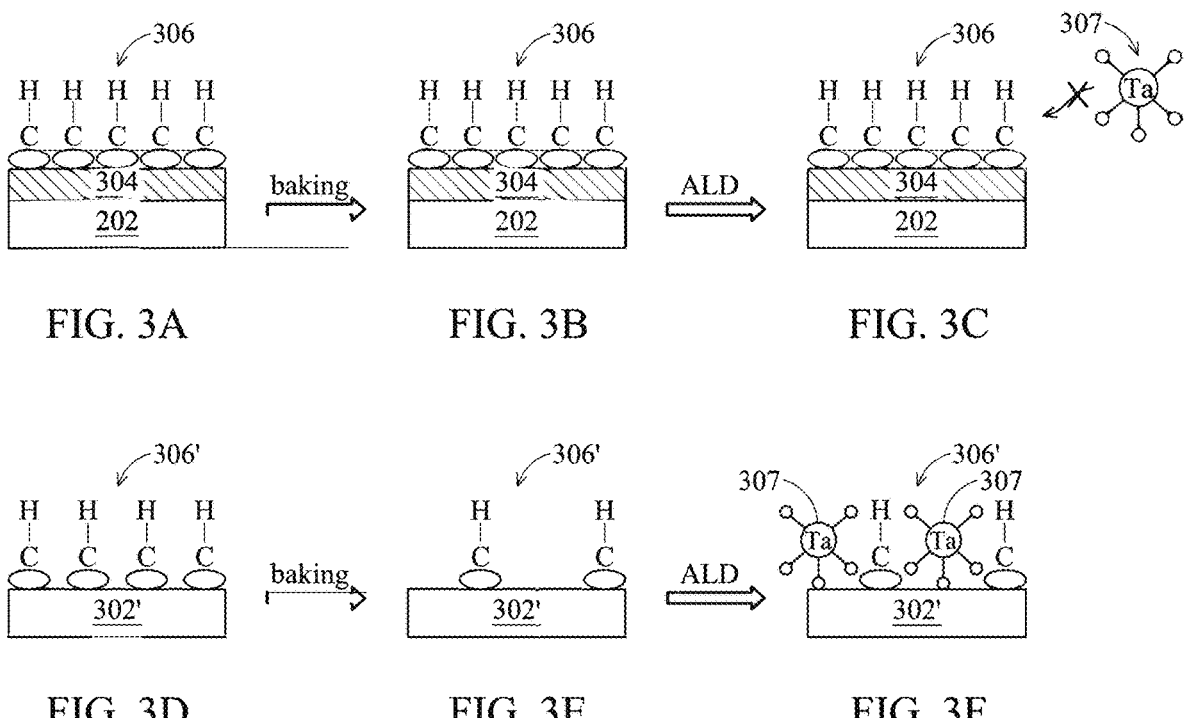
FIG. 3A                    FIG. 3B                    FIG. 3C
FIG. 3D                    FIG. 3E                    FIG. 3F

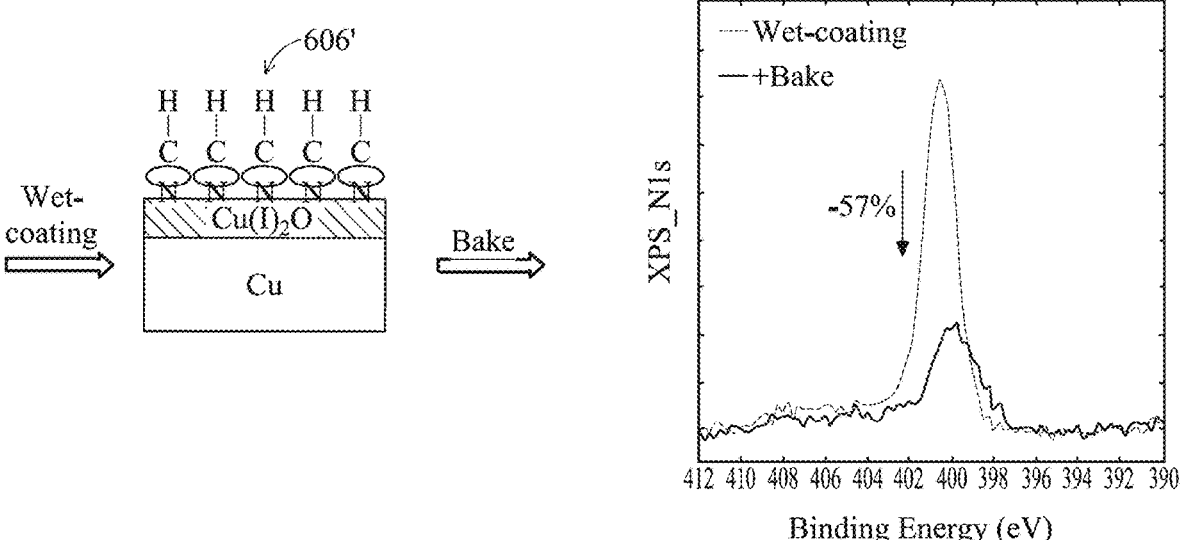
FIG. 6C                    FIG. 6D

+ Wet pre-
trt.

702

Cu(II)
Cu(I)₂O
Cu

Surface modification
identified by XPS

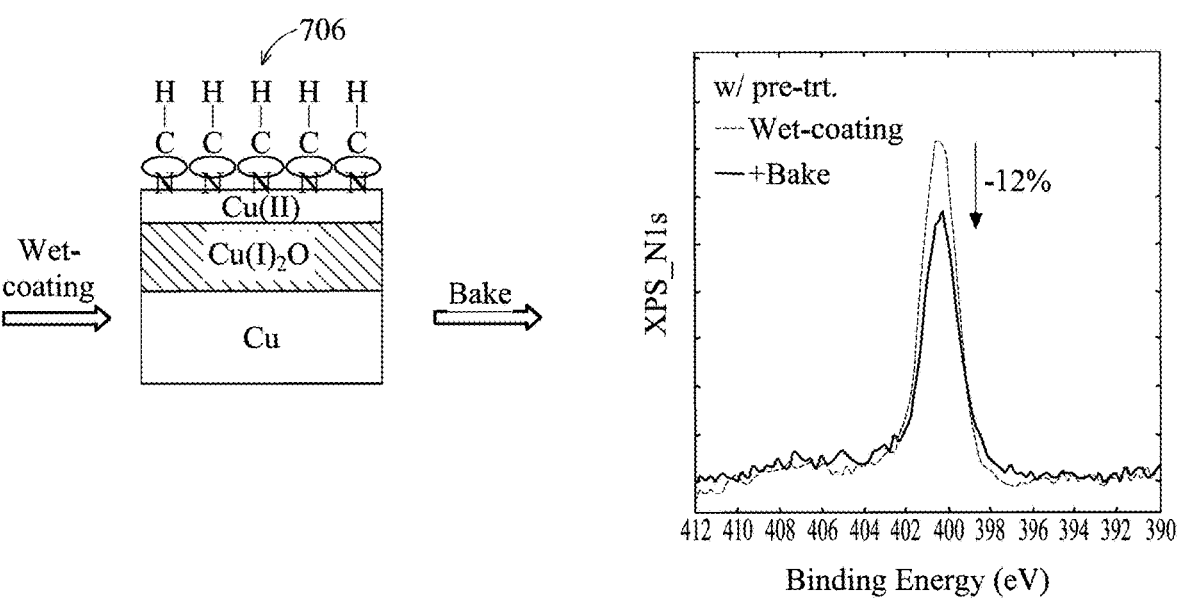
FIG. 7C                                FIG. 7D

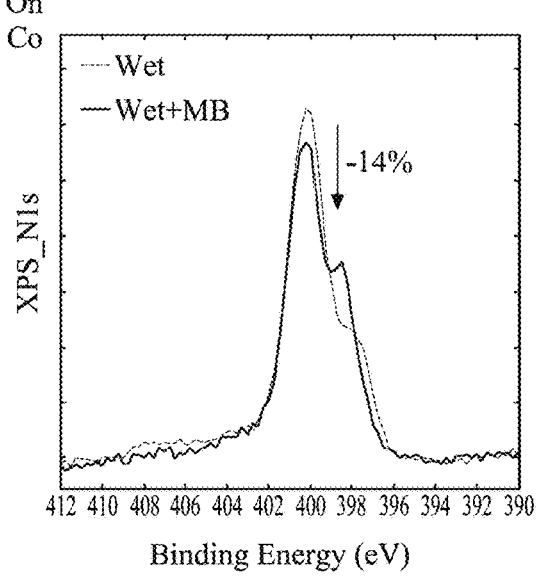
FIG. 10A                    FIG. 10B

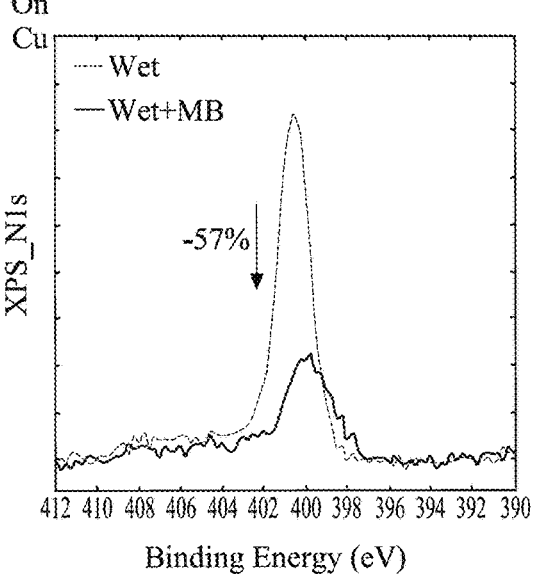
FIG. 10C                                FIG. 10D

1210A

1207A

1210B

1207B

Wet-blocking layer

CuOx

On Co

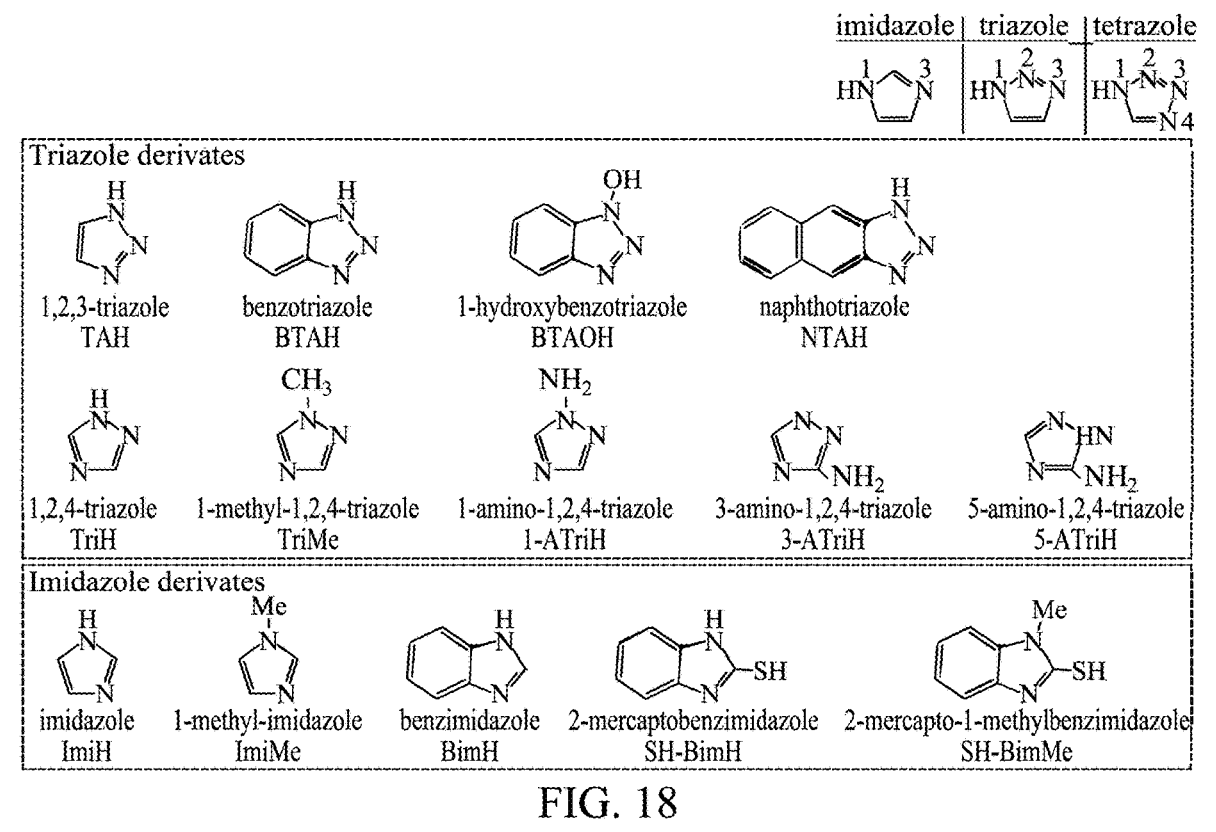

| imidazole | triazole | tetrazole |
|---|---|---|

Triazole derivates

1,2,3-triazole
TAH benzotriazole
BTAH 1-hydroxybenzotriazole
BTAOH naphthotriazole
NTAH 1,2,4-triazole
TriH 1-methyl-1,2,4-triazole
TriMe 1-amino-1,2,4-triazole
1-ATriH 3-amino-1,2,4-triazole
3-ATriH 5-amino-1,2,4-triazole
5-ATriH

Imidazole derivates imidazole
ImiH 1-methyl-imidazole
ImiMe benzimidazole
BimH 2-mercaptobenzimidazole
SH-BimH 2-mercapto-1-methylbenzimidazole
SH-BimMe

FIG. 18

INTERCONNECT STRUCTURE FOR SEMICONDUCTOR DEVICE AND RELATED METHODS

BACKGROUND

The present disclosure relates generally to the field of semiconductor manufacturing and more specifically to interconnect structures for semiconductor devices and methods of their fabricating.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, as the critical dimension (CD) of devices are scaled down, any variations in the CD may become more relevant, including resulting variations in the contact resistance (Rc) of a metal structure in an IC device. However, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A-G illustrate a general procedure of forming an interconnect structure.

FIG. 3A-F show TaN deposition blocking in a known method of forming an interconnect structure.

FIG. 6A-D provide X-ray photoelectron spectroscopy data and related illustrations for steps show TaN deposition blocking in a known method of forming an interconnect structure.

FIG. 7A-D provide X-ray photoelectron spectroscopy data and related illustrations for steps show TaN deposition blocking in a method of forming an interconnect structure according one of embodiments.

FIG. 10A-D provide X-ray photoelectron spectroscopy data a known method of forming an interconnect structure and a method of forming an interconnect structure according one of embodiments.

FIG. 18 illustrates exemplary nitrogen containing blocking materials.

DETAILED DESCRIPTION

Figure 1A:
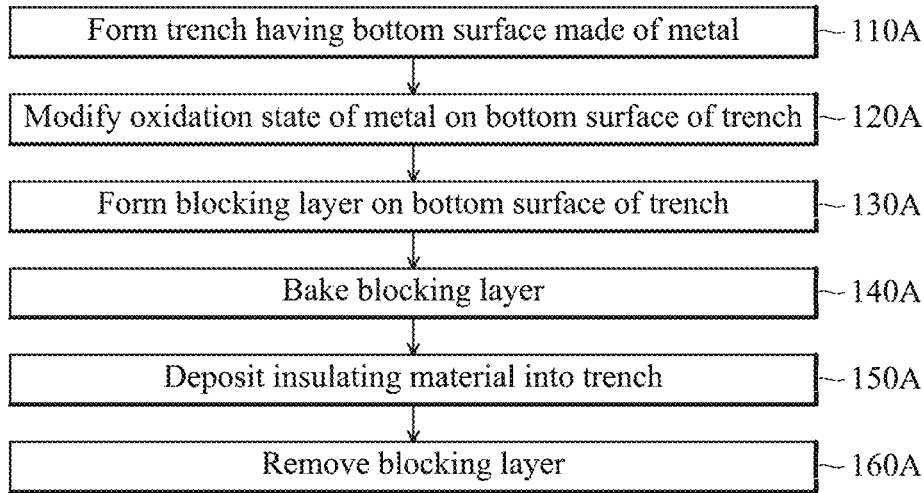
FIG. 1A-C is method charts for fabricating an interconnect structure according to some of embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a flow chart of a method 100A for fabricating an interconnect structure for a semiconductor device according to one of embodiments. Method 100A includes the following operations: operation 110A of forming a trench through one or more dielectric layers so that the trench has its side surface formed of the one or more dielectric layers and its bottom surface formed of a metal: operation 120A of modifying an oxidation state of the metal at the bottom surface of the trench; operation 130A of forming a blocking layer on the bottom surface of the trench: operation 140A of baking the blocking layer on the bottom surface of the trench; operation 150A of depositing an insulating material into the trench: and operation 160A of removing the blocking layer from the bottom surface of the trench. The modification of the oxidation state of the metal at the bottom surface of the trench in operation 120A may stabilize the blocking layer to withstand the baking in operation 140A. As such the blocking layer is present in a sufficient amount on the bottom surface of the trench during operation 150A of the deposition of the insulating material to block the deposition of the insulating material on the bottom surface of the trench so that the insulating material is selectively deposited on the side surface of the trench. The selective deposition on the side surface of the trench means that a thickness of the insulating material deposited on the side surface of the trench is larger than a thickness of the insulating material deposited on the bottom surface of the trench. Having less or no insulating material deposited on the bottom surface of the trench may reduce a contact resistance of the interconnect structure through the metal on the bottom surface of the trench. In some embodiments, a ratio between a thickness of the deposited insulating material on the side surface or the side walls and a thickness of the deposited insulated material on the bottom surface of the trench may be at least 2.1 or at least 2.2 or at least 2.3 or at least 2.4 or at least 2.5 times. In some embodiments, the ratio between the thickness of deposited insulating material on the side wall or the side surface and the thickness of the deposited insulating material on the bottom surface of the trench may be from 2.1 to 10 or from 2.2 to 8 or from 2.3 to 6 or 2.4 to 5 or 2.5 to 4 or 2.5 to 3 or 2.5 to 2.9 or any value or subrange within those ranges.

Figure 1B:
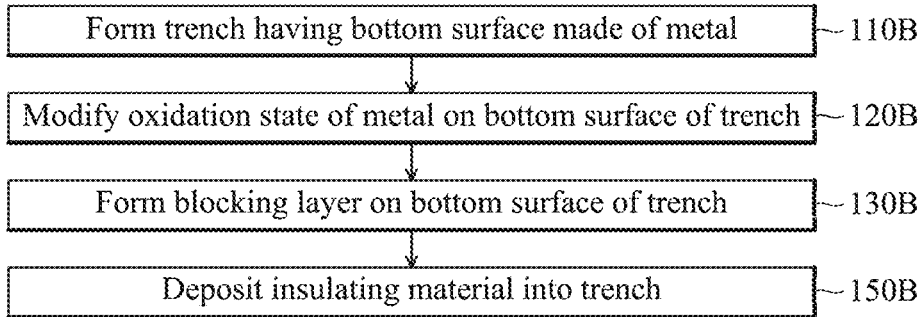

FIG. 1B is a flow chart of a method 100B for fabricating an interconnect structure for a semiconductor device according to one of embodiments. Method 100B includes the following operations: operation 110B of forming a trench through one or more dielectric layers so that the trench has its side surface formed of the one or more dielectric layers and its bottom surface formed of a metal: operation 120B of modifying an oxidation state of the metal at the bottom surface of the trench; operation 130B of forming a blocking layer on the bottom surface of the trench: and operation 150B of depositing an insulating material into the trench. Operations 110B, 120B, 130B and 150B may be similar to operations 110A, 120A, 130A and 150A, respectively. In some embodiments, a ratio between a thickness of the deposited insulating material on the side surface or the side walls and a thickness of the deposited insulated material on the bottom surface of the trench may be at least 2.1 or at least 2.2 or at least 2.3 or at least 2.4 or at least 2.5 times. In some embodiments, the ratio between the thickness of deposited insulating material on the side wall or the side surface and the thickness of the deposited insulating material on the bottom surface of the trench may be from 2.1 to 10 or from 2.2 to 8 or from 2.3 to 6 or 2.4 to 5 or 2.5 to 4 or 2.5 to 3 or 2.5 to 2.9 or any value or subrange within those ranges.

Figure 1C:
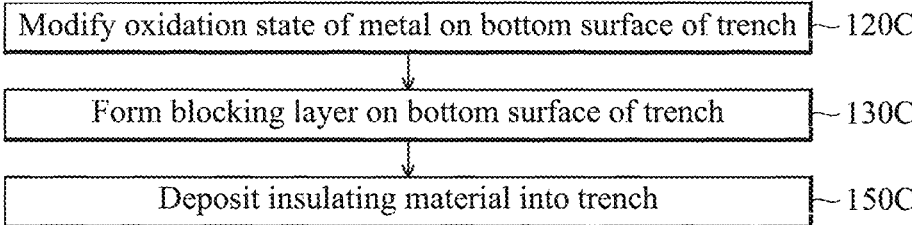

FIG. 1C is a flow chart of a method 100C for selective deposition according to one of embodiments. Method 100C may be used, for example, for fabricating an interconnect structure for a semiconductor device. Method 100C includes the following operations: operation 120C of modifying an oxidation state of a metal at a bottom surface of a trench which has a dielectric side surface; operation 130C of forming a blocking layer on the bottom surface of the trench: and operation 150C of depositing an insulating material into the trench. Operations 120C, 130C and 150C may be similar to operations 120A, 130A and 150A, respectively. Method 100C may provide selective deposition of the insulating material on the side surface of the trench so that a thickness the deposited insulating on the side surface of the trench is greater than a thickness of the insulating material on the bottom surface of the trench. For example, in some embodiments, a ratio between a thickness of the deposited insulating material on the side surface and a thickness of the deposited insulated material on the bottom surface of the trench may be at least 2.1 or at least 2.2 or at least 2.3 or at least 2.4 or at least 2.5 times. In some embodiments, the ratio between the thickness of deposited insulating material on the side surface and the thickness of the deposited insulating material on the bottom surface may be from 2.1 to 10 or from 2.2 to 8 or from 2.3 to 6 or 2.4 to 5 or 2.5 to 4 or 2.5 to 3 or 2.5 to 2.9 or any value or subrange within those ranges.

Figures 2A, 2B, 2C, 2D, 2E:
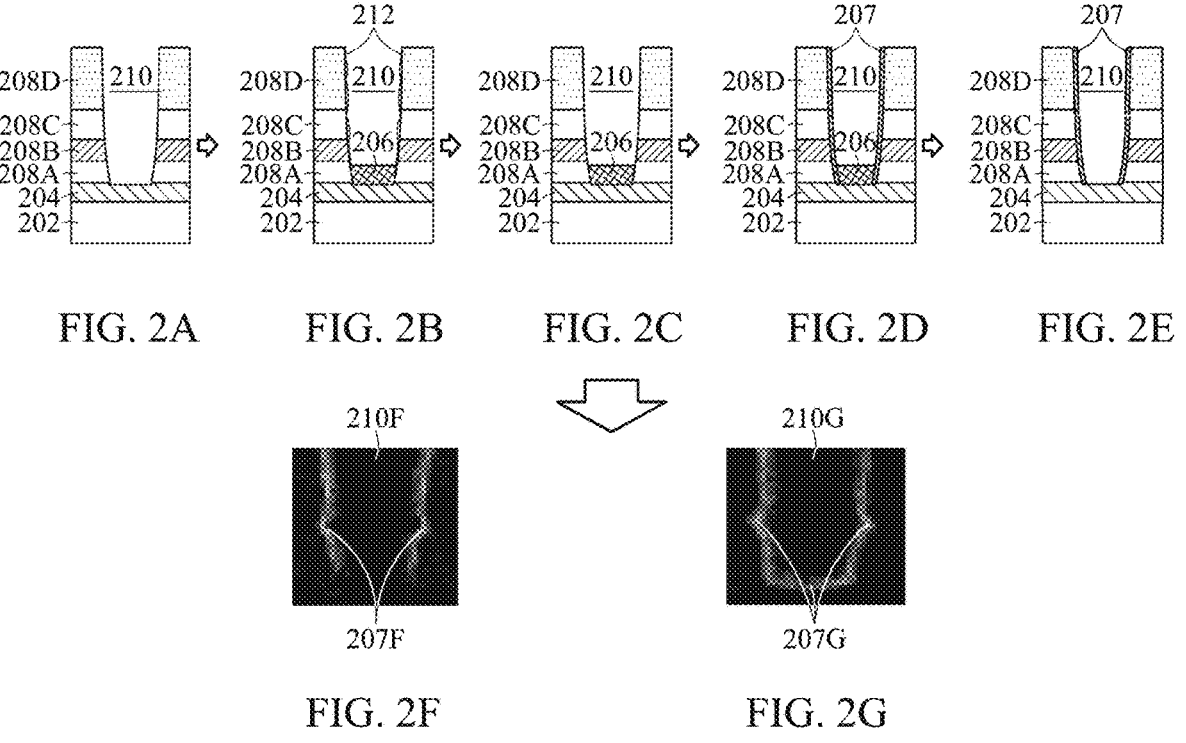

FIGS. 2A-E show a general procedure of forming an interconnect structure. FIG. 2A shows trench 210 formed through one or more dielectric layers, such as layers 208A, 208B, 208C and 208D stacked on metal layer 204, which may be on metal layer 202. Although FIG. 2A shows two metal layers 202 and 204, only one metal layer 202 may be used. Also although FIG. 2A shows four dielectric layers 208A, 208B, 208C and 208D, a smaller or larger number of dielectric layers stacked on a metal layer may be used. For example, a number of dielectric layers stacked on a metal layer, such layer 202 or 204, may be one, two, three, four, five, six, seven, eight, nine, ten, etc. Trench 210 has its bottom surface formed of a metal of metal layer 202 or 204 and its side surfaces formed of dielectric(s) of the dielectric layer(s), such as dielectric layers 208A, 208B, 208C and 208D. Trench 210 may formed by etching, such as dry etching, through the one or more dielectric layer, such as layers 208A-208D. For example, reactive ion etching (RIE) may be used for dry etch process. The dry etch process may involve using one or more of gases, such as $C_xF_y$, $O_2$, $N_2$, $H_2$, Ar, $CO_2$.

The dielectric layer, such as layer 208A, closest to the metal layer may be an etch stop layer, which may be made of aluminum oxide, e.g. $AlO_x$ or oxygen-doped (silicon) carbide (ODC). In some embodiments, the dielectric layers may include more than one etch stop layers. In an exemplary embodiment, layer 208A may be an aluminum oxide layer, such as $AlO_x$ layer; layer 208B may be an ODC layer, layer 208C may be another aluminum oxide layer; layer 208D may be a low-k (LK) layer made of an low-k insulating material having a low-k dielectric constant, for example, of about 3.9 or less or 3.5 or less or 3.0 or less. The low-k material may include one or more Si, O, C. Examples of low-k materials include porous silicon dioxide, porous organosilicate glass, organic polymeric dielectrics, such as polyimide, polynorbornenes, benzocyclobutene, and PTFE; silicon based polymeric dielectric, such as hydrogen silsesquioxane and methylsilsesquioxane. In some embodiments, the dielectric layers stacked on the metal layer may include at least one etch stopper layer and at least one low-k dielectric layer.

Following its formation, trench 210 may be wet stripped, baked and pre-cleaned to remove by-products of etching. The wet stripping may involve exposing the trench to a liquid stripping agent or solution, which may include an oxidizer, such as $H_2O_2$, and/or a base, such as NaOH, KOH or $NH_4OH$. The baking may be performed at an elevated temperature, such as 200 C-350 C or 250 C to 325 C or 270 C to 310 C or about 300 C. The baking may remove residual liquid left after the wet stripping. The pre-cleaning may be performed using plasma, such as $H_2$ plasma. In some embodiments, the pre-cleaning may be performed using $H_2/Ar$ at low pressure, such as below 5 Torr.

FIG. 2B shows deposition on blocking material 206 deposited on the bottom surface of trench 210. Blocking material 206 preferably has terminal OH groups, terminal NH groups or terminal $CH_x$ groups. Blocking material 206 with terminal $CH_x$ groups may provide greater blocking with tantalum nitride then materials with terminal OH groups or terminal NH groups. Because deposition of blocking material 206 may be performed using wet coating from a solution containing the blocking material, FIG. 2B shows solvent 212 of the wet coating solution, a solvent, on side walls and bottom surface of trench 210.

FIG. 2C shows trench 210 with blocking material 206 on its bottom surface after baking. The baking results in removal of the solvent of wet coating solution from the trench. Accordingly, solvent 212 of the wet coating solution is not shown on the side walls and the bottom surface in FIG. 2C.

FIG. 2D shows trench 210 after deposition insulating material 207 into trench 210, while FIG. 2E shows trench 210 with deposited insulating material 207 after removing blocking material 206 is removed from the bottom surface of trench 210. Insulating material 207 may be tantalum nitride. Insulating material 207 may be deposited using a physical deposition technique such as atomic layer deposition.

As illustrated in FIGS. 2D and 2E, it may be desirable to deposit insulating material 207 on side surface of trench 210 while using blocking material 206 on the bottom surface of trench 210 to prevent or minimize deposition of insulating material 207 on the bottom surface of trench 210. Preventing or minimizing deposition of insulating material 207 on the bottom surface of trench 210 may reduce contact resistance through a metal layer, such layer 202 and/or 204.

However, this desired configuration of selective deposition of insulating material 207 of the side surface of trench 210 is not always achieved in reality due to an insufficient amount of blocking material 206 on the bottom surface of trench 210 prior to deposition of insulating material 207 into trench 210. For example, blocking material 206 may be thermally unstable to withstand the baking in FIG. 2C. As the result of such thermal instability, blocking material 206 may be lost from the bottom surface of trench 210 during the baking resulting in an amount of blocking material 206 on the bottom surface of trench 210 prior to deposition of insulating material 207 into trench 210, which amount is insufficient for the desired selective deposition of insulating material 207 of the side surface of trench 210.

FIG. 2F is an EELS (electron energy loss spectroscopy for elemental analysis) image (map) of an actual trench 210F, which is similar to trench 210, with tantalum nitride as insulated material 207F selectively deposited on the side surface of the trench with essentially no tantalum nitride deposited on the bottom surface of the trench. No tantalum nitride deposited on the bottom surface of the trench means a lower contact resistance for the structure in FIG. 2F because there is no barrier due to tantalum nitride on the bottom surface of the trench. FIG. 2F corresponds to the situation when an amount of blocking material 206 on the bottom surface of trench 210 prior to deposition of insulating material 207 into trench 210 was sufficient to block deposition of insulating material 207 on the bottom surface of trench 210.

FIG. 2G is an EELS image (map) of an actual trench 210G, which is similar to trench 210, with tantalum nitride as insulated material 207G deposited on both the side surface and the bottom surface of the trench. FIG. 2G corresponds to the situation w % ben an amount of blocking material 206 on the bottom surface of trench 210 prior to deposition of insulating material 207 into trench 210 was insufficient to block deposition of insulating material 207 on the bottom surface of trench 210. Tantalum nitride on the bottom surface of the trench in FIG. 2G means a higher contact resistance for the structure in FIG. 2G because tantalum nitride on the bottom surface of the trench serves as a barrier for electrical current.

FIGS. 3A-F illustrate a known method of forming an interconnect structure by schematically showing what happens on a bottom surface of a trench, such as trench 210. Specifically, FIGS. 3A-C illustrate a situation with two metal layers: highly conductive metal layer 302, such as a Cu layer, and capping layer 304, such as a Co layer, which is a lower conductive layer and which forms the bottom surface of the trench. FIGS. 3D-F illustrate a situation with a single high conductive metal layer 302', such as a Cu layer, which forms the bottom surface of the trench.

Blocking layer 306 deposited on Co layer 304 in FIG. 3A withstands baking in FIG. 3B and as the result, blocking layer 306 is present in a sufficient amount to prevent or minimize deposition of tantalum nitride 307 in FIG. 3C on Co layer 304.

Blocking layer 306' deposited on Cu layer 302' in FIG. 3D is not sufficiently stable to withstand baking in FIG. 3E. As the result, blocking material 306' is getting lost from Cu layer 302' during the baking. Due to this loss, an amount of blocking layer 306's is insufficient to prevent deposition of tantalum nitride 307 on Cu layer 302', FIG. 3F.

Figure 4:
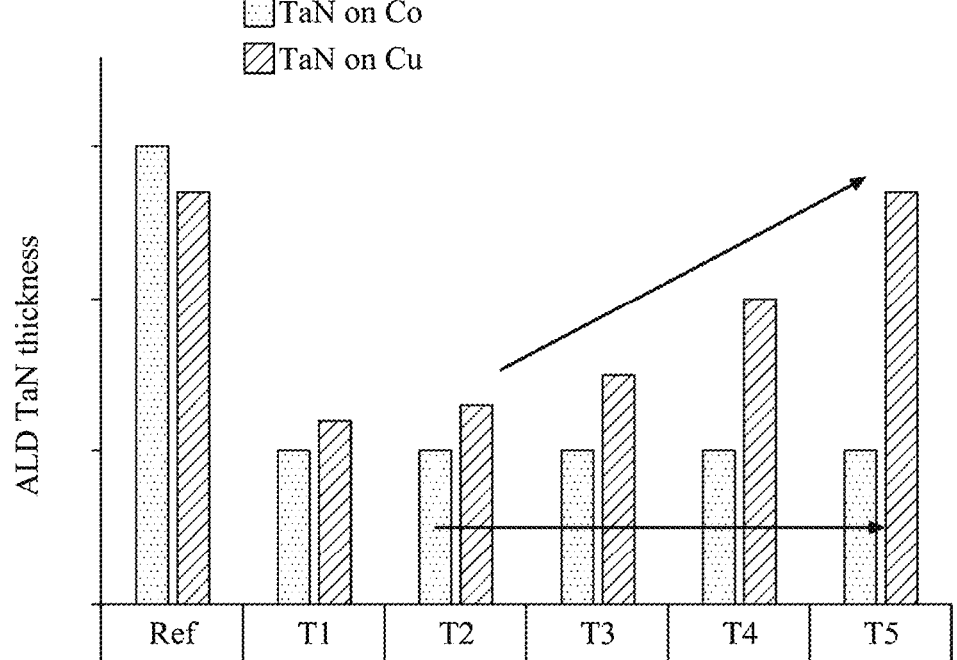
FIG. 4 is a plot showing TaN deposition according to a known method.

FIG. 4 is a plot comparing a thickness on tantalum nitride deposited via atomic layer deposition on a Cu layer, such as layer 302', or a Co layer, such layer 304 with an increased baking temperature for a blocking material, such as material 306' or 306, in comparison to Reference ("Ref") for which tantalum nitride was deposited via atomic layer deposition on a Cu layer, such as layer 302', or a Co layer, without any blocking material. TaN thickness was measured by X-ray fluorescence (XRF) by detecting Ta intensity and converting it to a thickness. In FIG. 4, the reference (Ref.) corresponds to the situation when no baking performed. $T_1$, $T_2$, $T_3$, $T_4$ and $T_5$ correspond to baking performed for 60 seconds at 200 C, 250 C, 275 C, 300 C and 345 C respectively. The data in FIG. 4 shows that while for the Co layer, a thickness of the deposited tantalum nitride did not change with the baking temperature, for the Cu layer, a thickness of the deposited tantalum nitride increases with an increasing baking temperature reaching the reference thickness indicating no blocking material for the baking temperature of 345° C. For the baking temperature of 250 C, a selectivity index, i.e, a ratio between a thickness of deposited TaN of sidewalls of a trench to a thickness of deposited on a bottom surface of the trench, was 2.1 for Cu being at the bottom surface and 3.0 for Co being at the bottom surface. For the baking temperature of 345 C, a selectivity index, i.e, a ratio between a thickness of deposited TaN of sidewalls of a trench to a thickness of deposited on a bottom surface of the trench, was 1.0 for Cu being at the bottom surface and 3.0 for Co being at the bottom surface. The selectivity index of 1.0 for the baking temperature of 345 C for Cu indicates that baking at 345 C results in effective no blocking material being present on Cu after the baking. Thus, the results for the Cu layer in FIG. 4 indicate a loss of the blocking material due to thermal desorption during the baking and no loss of the blocking material for the Co layer.

Figures 5A, 5B, 5C, 5D, 5E, 5F:
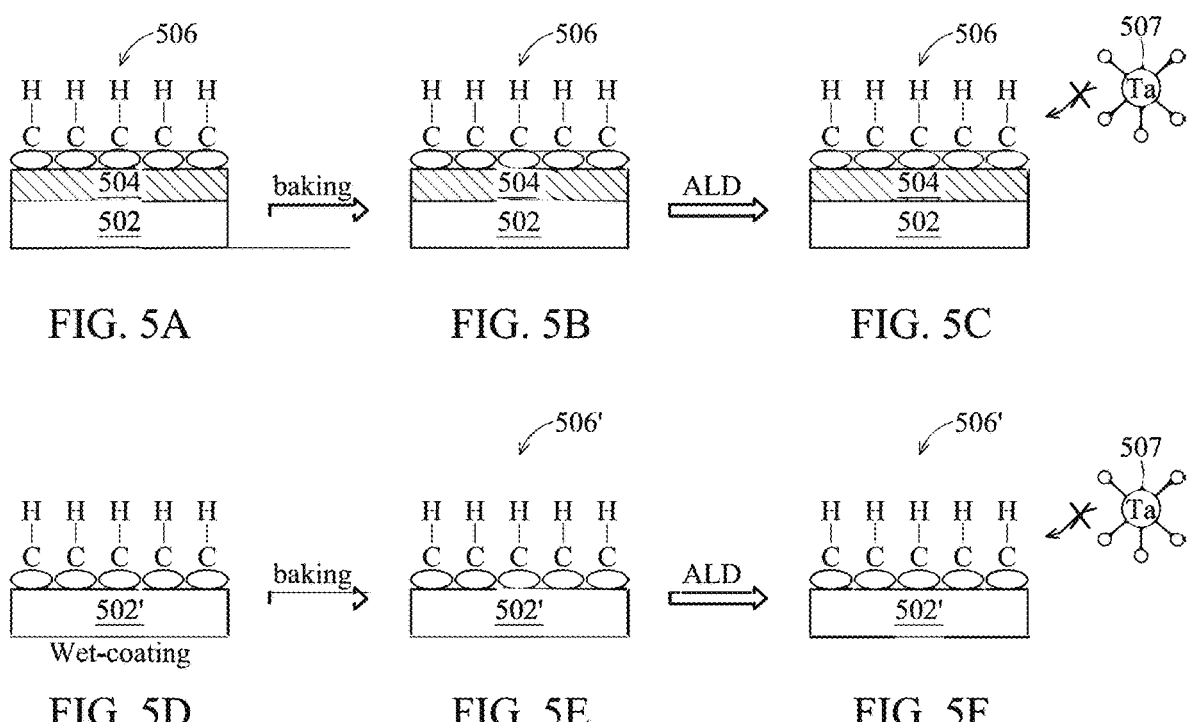
FIG. 5A-F show TaN deposition blocking in a method of forming an interconnect structure according one of embodiments.

FIGS. 5A-F illustrate a method of forming an interconnect structure according to one of the embodiments by schematically showing what happens on a bottom surface of a trench, such as trench 210. The method in FIGS. 5A-F involves treating a surface of a metal. FIGS. 5A-C illustrate a situation with two metal layers: highly conductive metal layer 502, such as a Cu layer, and capping layer 504, such as a Co layer, which is a lower conductive layer and which forms the bottom surface of the trench. FIGS. 5D-F illustrate a situation with a single high conductive layer metal 502', such as a Cu layer, which forms the bottom surface of the trench.

Prior to deposition of blocking material 506 or 506' on Co layer 504 or Cu layer 502' in FIG. 5A or 5E, Co layer 504 or Cu layer 502' are exposed to the same wet treatment. Such wet treatment may be a treatment with an aqueous solution containing one or both of $NH_4OH$ and $H_2O_2$. In many embodiments, the aqueous solution may contain both of $NH_4OH$ and $H_2O_2$. A concentration ratio between $NH_4OH$ and $H_2O_2$ in the solution may be from 0.05 to 20 or from 0.1 to 10 or from 0.2 to 5.0 or any value or subrange within these ranges. A concentration of $NH_4OH$ in the solution may be from 5 to 2000 ppm or from 10 to 1200 ppm or from 30 to 800 ppm. A concentration of $H_2O_2$ in the solution may be from 5 to 2000 ppm or from 10 to 1200 ppm or from 30 to 800 ppm.

After the treatment of Co layer 504, blocking layer 506 deposited on Co layer 504 in FIG. 5A withstands baking in FIG. 5B and as the result, blocking layer 506 is present in a sufficient amount to prevent or minimize deposition of tantalum nitride 507 in FIG. 5C on Co layer 504.

After the treatment of Cu layer 502', blocking layer 506' deposited on Cu layer 502' in FIG. 5D withstands baking in FIG. 5E and as the result, blocking layer 506' is present in a sufficient amount to prevent or minimize deposition of tantalum nitride 507 in FIG. 5F on Cu layer 502'.

While the situation for a Co layer in FIGS. 5A-C may be similar to the situation for a Co layer in FIGS. 3A-C, the situation for a Cu layer in FIGS. 5D-F is very different than the situation for a Cu layer in FIGS. 3D-F.

XPS data in FIGS. 6A-D and 7A-D show that the difference between the situation for a Cu layer in FIGS. 5D-F and the situation for a Cu layer in FIGS. 3D-F is a result of a change in the oxidation state of Cu due to the treatment with the aqueous solution. All the XPS data in this application was obtained using Al-Kα X-ray source (1486.6 eV).

Figure 6A:
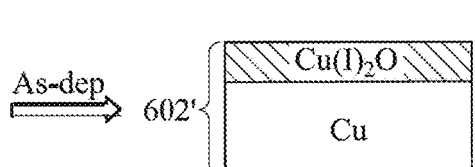
Figure 6B:
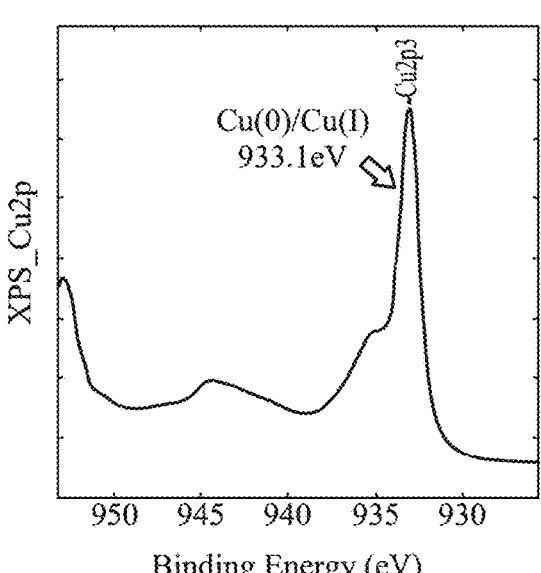

FIGS. 6A-D provide XPS data and related illustrations, which may correspond to the situation for a Cu layer in FIGS. 3D-F. Specifically. FIG. 6B shows XPS data for Cu2p peak for a Cu layer 602', which did not undergo treatment with the aqueous solution. FIG. 6B shows that the untreated Cu layer has a XPS peak corresponding to a mixture of Cu(0) and Cu(I) oxidation states with a maximum at about 933.1 eV. FIG. 6A schematically illustrates the situation supported by the XPS data in FIG. 6B. Specifically. FIG. 6A shows the untreated Cu layer 602' as a combination of two layers, a Cu(0) layer, and a Cu(I)$_2$O layer over the Cu(0) layer. FIG. 6C schematically shows deposition of a blocking layer 606' over the Cu layer 602', which is shown as the combination of the Cu(0) layer and the Cu(I)$_2$O layer over the Cu(0) layer. The blocking layer on the untreated Cu layer may be deposited, for example, by wet coating. FIG. 6D shows XPS for N1s peak for the Cu layer 602' following the deposition, such as wet coating, of the blocking layer 606' and following a subsequent baking at an elevated temperature, such as at least 200 C or at least 220 C or at least 250 C or at least 275 C or at least 300 C or at least 310 C or at least 320 C or at least 330 C. The elevated temperature for baking may be from 200 C to 400 C or from 250 C to 400 C or from 300 C to 400 C or from 330 C to 400 C or any value or subrange within those ranges. Due to the present of N in the blocking layer, the N1s peak XPS peak may serve as a measure of an amount of the blocking layer 606' on the Cu layer 602'. The XPS data show that the amount of the blocking layer on the Cu layer 602' is significantly (by about 57%) reduced after the baking. This indicates instability of the blocking layer on untreated Cu layer 602' due to desorption of the blocking layer's material during the baking.

Figure 7A:
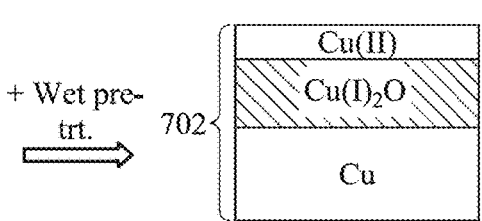
Figure 7B:
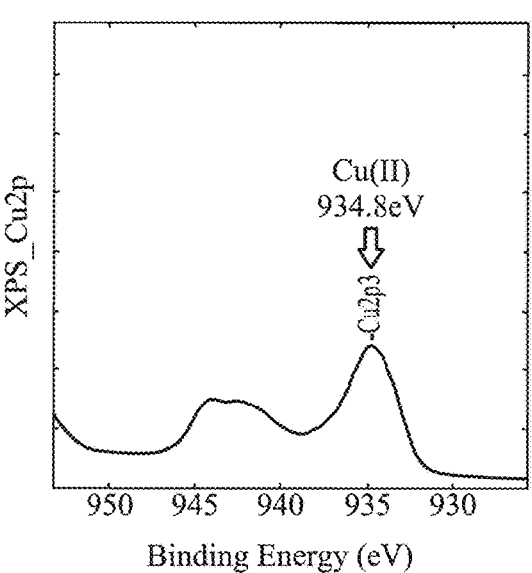

FIGS. 7A-D provide XPS data and related illustrations, which may correspond to the situation for a Cu layer in FIGS. 5D-F. Specifically, FIG. 7B shows XPS data for Cu2p peak for a Cu layer 702', which was subjected to treatment with the aqueous solution. FIG. 7B shows that the treated Cu layer has a XPS peak with a maximum at about 934.8 eV, which corresponds to Cu(II). The data in FIG. 7B provides evidence of the treatment with the aqueous solution modifies the oxidation state of copper in the Cu layer. FIG. 7A schematically illustrates the situation supported by the XPS data in FIG. 7B. Specifically, FIG. 7A shows the treated Cu layer 702' as a combination of three layers, a Cu(0) layer, a Cu(I)$_2$O layer over the Cu(0) layer and a Cu(II) layer over the Cu(I)$_2$O layer. The Cu(II) layer was formed due to the treatment of the Cu layer '702 with the aqueous solution. FIG. 7C schematically shows deposition of a blocking layer 706' over the Cu layer 702', which is shown as the combination of the Cu(0) layer, the Cu(I)$_2$O layer over the Cu(0) layer and the Cu(II) layer over the Cu(I)$_2$O layer. The blocking layer on the treated Cu layer may be deposited, for example, by wet coating. FIG. 7D shows XPS spectrum for N1s peak for the Cu layer 702' following the deposition, such as wet coating, of the blocking layer 706' and following a subsequent baking at an elevated temperature. Due to the present of N in the blocking layer, the N1s peak XPS peak may serve as a measure of an amount of the blocking layer 706' on the Cu layer 702'. The XPS data show that the amount of the blocking layer on the treated Cu layer 702' is only slightly (by about 12%) reduced after the baking. This indicates that the treatment of the Cu layer with the aqueous solution increases stability of the blocking layer on the Cu layer due to reduced desorption of the blocking layer's material during the baking.

Figure 8B:
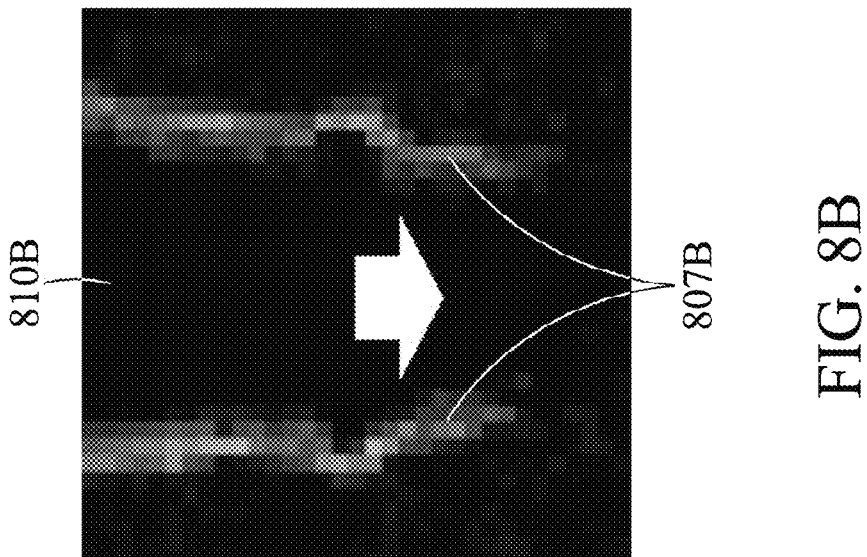
FIG. 8A-B are EELS (electron energy loss spectroscopy for elemental analysis) images (maps) showing TaN deposition for a known method of forming an interconnect structure and a method of forming an interconnect structure according one of embodiments.
Figure 8A:
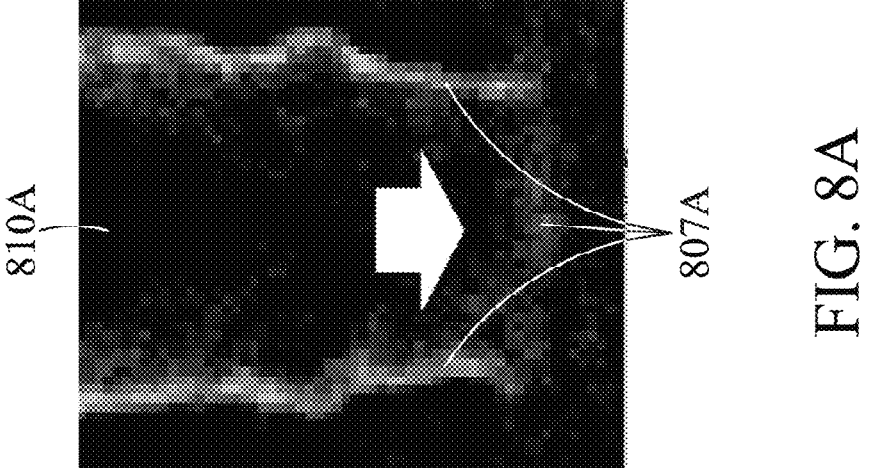

FIGS. 8A and 8B are EELS images (maps) of trenches with a copper bottom surface after a deposition of TaN. Specifically, FIG. 8A is an EELS image of trench 810A, the copper bottom surface of which was not treated with the aqueous solution that modifies the oxidation state of copper prior to deposition of a blocking material on the copper bottom surface. FIG. 8A shows a significant amount of TaN 807A deposited in the bottom copper surface (see the arrow in FIG. 8A) of trench 810A in addition to TaN 807A deposited of a side wall of trench 810A. This indicates an amount of the blocking material on the bottom copper surface of trench 810A in FIG. 8A was insufficient to effectively block TaN deposition on the bottom copper surface of the trench due to desorption of the blocking material from the bottom copper surface during a thermal baking. FIG. 8B is an EELS image of trench 810B. Unlike for trench 810A, the copper bottom surface for trench 810B in FIG. 8B was treated with the aqueous solution that modified the oxidation state of copper prior to deposition of a blocking material on the copper bottom surface. FIG. 8B shows that trench 810B has its bottom copper surface as substantially TaN free (see the arrow in FIG. 8B), while still having TaN 807B deposited on its side surface. This indicates that an amount of the blocking material on the bottom copper surface of trench 810B in FIG. 8B was sufficient to effectively block TaN deposition on the bottom copper surface of trench 810B.

Figure 9:
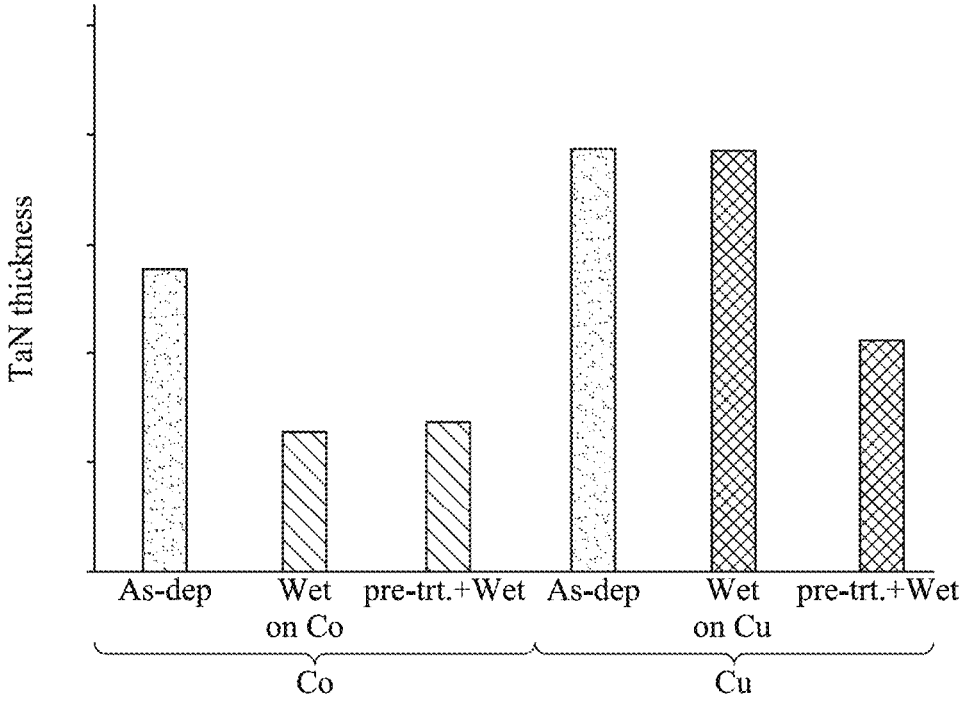
FIG. 9 a plot showing TaN deposition for a method of forming an interconnect structure according one of embodiments in comparison to a known method of forming an interconnect structure.

FIG. 9 is a plot comparing a thickness on tantalum nitride deposited via atomic layer deposition on a Cu layer or a Co layer. TaN thickness was measured by X-ray fluorescence (XRF) by detecting detect Ta intensity and converting it to a thickness. For each of the Cu layer and the Co layer, FIG. 9 reports thicknesses of TaN deposited via ALD for the following three situations: (A) for TaN deposition via ALD when no blocking material was used on the Co layer (or the Cu layer) labelled "As-dep" in FIG. 9; (B) for TaN deposition via ALD when a blocking material was wet coated on the Co layer (or the Cu layer), which was not treated with the aqueous solution labeled as "Wet on Co" (or "Wet on Cu") in FIG. 9; (C) for TaN deposition via ALD when a blocking material was wet coated on the Co layer (or the Cu layer), which was not treated with the aqueous solution labeled as "pre-trt.+Wet} in FIG. 9. For the Co layer, the blocking material provides effective blocking of TaN deposition for both non-treated Co layer ("Wet on Co") and treated Co layer (pre-trt.+Wet) because a thickness of deposited TaN is significantly smaller for the both "Wet on Co" and "pre-trt.+Wet" situations in comparison to the situation "As-dep" where no blocking material was used. The treatment with the aqueous solution does not affect the effectiveness of blocking of TaN deposition significantly. For the Cu layer, the blocking material does not effective blocking of TaN deposition for the non-treated Cu layer ("Wet on Cu") because a thickness of deposited TaN is essentially the same for the "Wet on Cu" situation and for the situation "As-dep" where no blocking material was used. For the Cu layer, the blocking material provides effective blocking of TaN deposition for only for the treated Co layer ("pre-trt.+Wet") because a thickness of deposited TaN is significantly smaller for the "pre-trt.+Wet" situation in comparison to the situation "As-dep" where no blocking material was used.

FIG. 10A-D show XPS spectra for N1s peak for a nitrogen-containing blocking material deposited on (A) a Co surface which was not treated with the aqueous solution before the wet coating of the blocking material; (B) a Co surface which was treated with the aqueous solution before the wet coating of the blocking material: (C) a Cu surface which was not treated with the aqueous solution before the wet coating of the blocking material: (D) a Cu surface which was treated with the aqueous solution before the wet coating of the blocking material. Due to the present of N in the blocking material, the Nis peak XPS peak may serve as a measure of an amount of the blocking material. Each of FIG. 10A-D present two XPS spectra: one after the wet-coating deposition of the blocking material but before thermal baking ("Wet") and the other after the thermal baking. In FIGS. 10A, 10B and 10D no significant loss of the blocking material due to the baking is observed. In FIG. 10C, a substantial (57%) loss of the blocking material after the baking is observed. FIGS. 10C and 10D present the same information as FIGS. 6D and 7D, respectively.

Figure 11A:
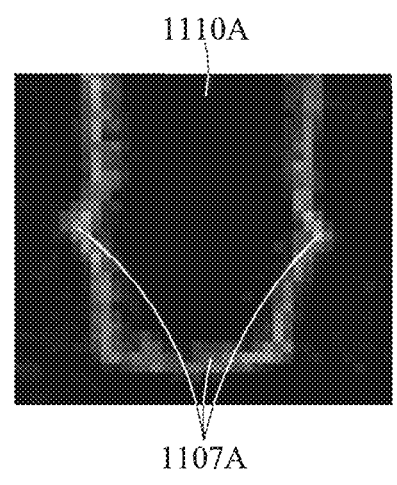
FIG. 11A-D provide EELS images (maps) and related illustrations for TaN deposition for a method of forming an interconnect structure according one of embodiments.

FIG. 11A-D provide EELS images (maps) and related illustrations for TaN deposition. FIG. 11A is an image of trench 1110A for which a blocking material was not deposited on its bottom surface prior to TaN deposition via ALD.

Accordingly, trench 1110A in FIG. 11A has approximately the same thickness of deposited TaN 1107A on its bottom surface and on its sidewalls. A ratio between a thickness of deposited TaN on the bottom surface and a thickness of deposited TaN 1107A on the sidewalls of trench 1110A in FIG. 11A may be from 0.95 to 1.05.

Figure 11B:
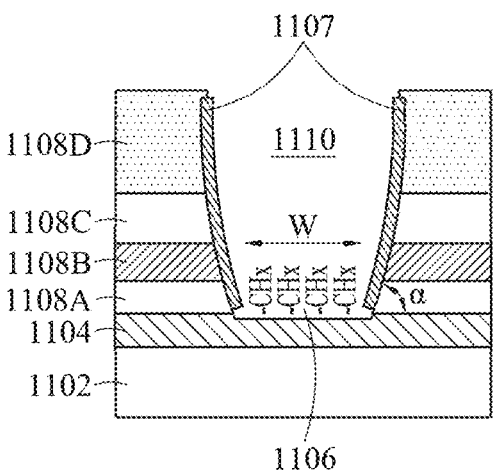

FIG. 11B shows exemplary trench 1110 having portion of metal layer 1104, which may be Co layer or a Cu layer, at its bottom surface. Trench 1110 is formed through dielectric layer(s), such as layers 1108A-1108D. Metal layer 1104 may be over another metal layer 1102, which may be Cu layer. Trench 1110 has its sidewall(s) leaning inward and may have angle α between its sidewall and a portion of metal layer 1104, which is outside of trench 1110, between about 75° and about 90°. A characteristic lateral dimension of the bottom surface of the trench, such as a diameter, may be from 5 to 30 nm or from 8 to 25 nm or from 12 to 18 nm or any value or subrange within those ranges. Prior to deposition of a dielectric layer, such as a TaN layer, blocking material 1106 is deposited on the bottom surface of trench 1110. Blocking material 1106 blocks deposition of the dielectric material, such as TaN, on the bottom surface of trench 1110. As such, the dielectric material is deposited selectively on the side wall of trench 1110. The dielectric material deposited on the side walls on trench 1110 is shown as element 1107. A thickness of the dielectric material 1107 on the sidewalls on trench 1110 may be from 10 to 30 Å or from 10 to 20 Å or from 12 to 18 Å or from 14 to 16 Å.

Figure 11C:
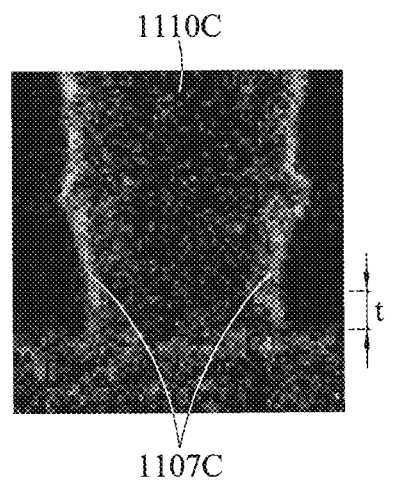

FIG. 11C is an EELS image (map) of a trench 1110A, which is similar to trench 1110, after deposition of TaN. Prior to the TaN deposition, a blocking material, such as blocking material 1106, was deposited on the bottom surface of the trench 1110A in FIG. 11C. As the result of the blocking material deposition, TaN 1107A is deposited mostly on sidewalls of the trench in FIG. 11C, with very little TaN deposited on the bottom surface of the trench. Use of the blocking material may effectively eliminate TaN deposited on the bottom surface of the trench 1110A and/or reduce a thickness (t) of TaN deposited on the bottom surface of the trench compared to a thickness of TaN deposited on the sidewalls of the trench by 1 to 16 Å or by 2 to 12 Å or by 5 to 10 Å or by 7 to 8 Å or any value or subrange within those ranges.

Figure 11D:
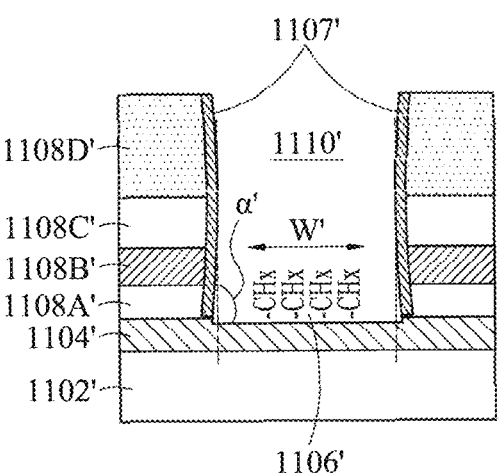

FIG. 11D trench 1110' having portion of metal layer 1104' at its bottom surface. Trench 1110' is formed though dielectric layer(s), such as layers 1108A'-1108D'. Metal layer 1104' may be over another metal layer 1102', which may be Cu layer. Trench 1110' has its sidewall(s) leaning outward and may have angle α between its sidewall and a portion of metal layer 1104', which is outside of trench 1110', between greater than 90°. Trench 1110' with its side wall leaning outward may be less favorable than trench 1110 of FIG. 11B, which has its side wall leaning inward.

Figure 12A:
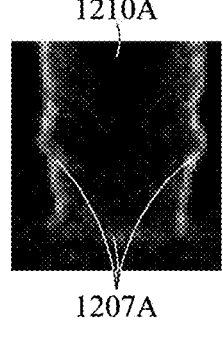
FIG. 12A-D provide EELS images (maps) and related illustrations for TaN deposition for a method of forming an interconnect structure according one of embodiments.

FIG. 12A-D provide images and related illustrations for TaN deposition. FIG. 12A is an EELS image (map) of a trench 1210A for which a blocking material was deposited on its bottom surface prior to TaN deposition via ALD. The bottom surface of the trench 1210A in FIG. 12A was not treated with the aqueous solution. A ratio between a thickness of deposited TaN 1207A on the side walls or the side surface and a thickness of deposited TaN 1207A on the bottom surface (see the arrow in FIG. 12A) of the trench 1210A in FIG. 21A may be from 1.5 to 2.0.

Figure 12B:
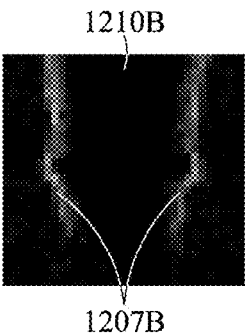

FIG. 12B is an EELS image (map) of a trench 1210B for which a blocking material was deposited on its bottom surface prior to TaN deposition via ALD. The bottom surface of the trench 1210B in FIG. 12B was treated with the aqueous solution. A ratio between a thickness of deposited TaN 1207B on the side walls or the side surface and a thickness of deposited TaN on the bottom surface of the trench in FIG. 12A may be at least 2.1 or at least 2.2 or at least 2.3 or at least 2.4 or at least 2.5 times. For example, in some embodiments, the ratio between the thickness of deposited TaN 1207B on the side walls or the side surface and the thickness of deposited TaN 1207B on the bottom surface (see the arrow in FIG. 12B) of the trench may be from 2.1 to 10 or from 2.2 to 8 or from 2.3 to 6 or 2.4 to 5 or 2.5 to 4 or 2.5 to 3 or 2.5 to 2.9 or any value or subrange within those ranges.

Figure 12C:
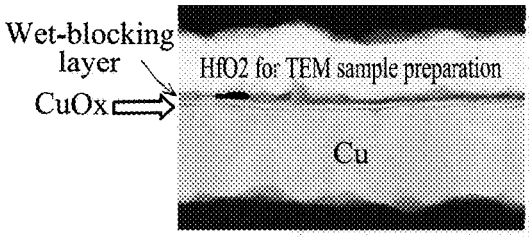

FIG. 12C is a transmission electron microscope (TEM) image of a copper film after treatment with an aqueous solution comprising $NH_4OH$ and $H_2O_2$ and a subsequent deposition of a blocking material on the treated surface of the copper film. The TEM image shows a $CuO_x$ layer on Cu and the blocking material formed on the $CuO_x$ layer.

Figure 12D:
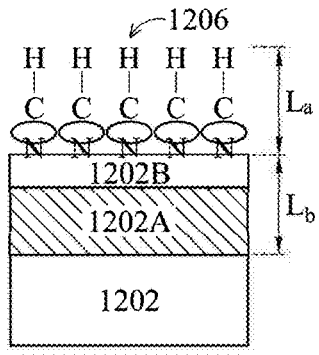

FIG. 12D is a schematic illustration based on the TEM image in FIG. 12C. FIG. 12D shows a copper film 1202, which has on its surface $Cu(I)_2O$ layer 1202A and $Cu(II)$ layer 1202B. $Cu(II)$ layer 1202B was formed by the treatment with the aqueous solution comprising $NH_4OH$ and $H_2O_2$ which modified an oxidation state of copper. Layers 1202A and 1202B together correspond to the $CuO_x$ layer in the TEM image of FIG. 12C. FIG. 12D shows layer 1206 of a blocking material. For illustrative purposes only, FIG. 12D shows the blocking material as a nitrogen containing blocking material. In some embodiments, a combined thickness of layers 1202A and 1202B, i.e, a thickness of the $CuO_x$ layer, may be from 2.0 nm to 5 nm or from 2.2 nm to 4 nm or 2.5 nm to 3.2 nm or any value or subrange within these ranges. In some embodiments, a thickness of blocking material layer may be from 0.8 nm to 2.5 nm or from 1.0 nm to 2.0 nm or from 1.2 nm to 1.6 nm or any value or subrange within these ranges.

Figure 13:
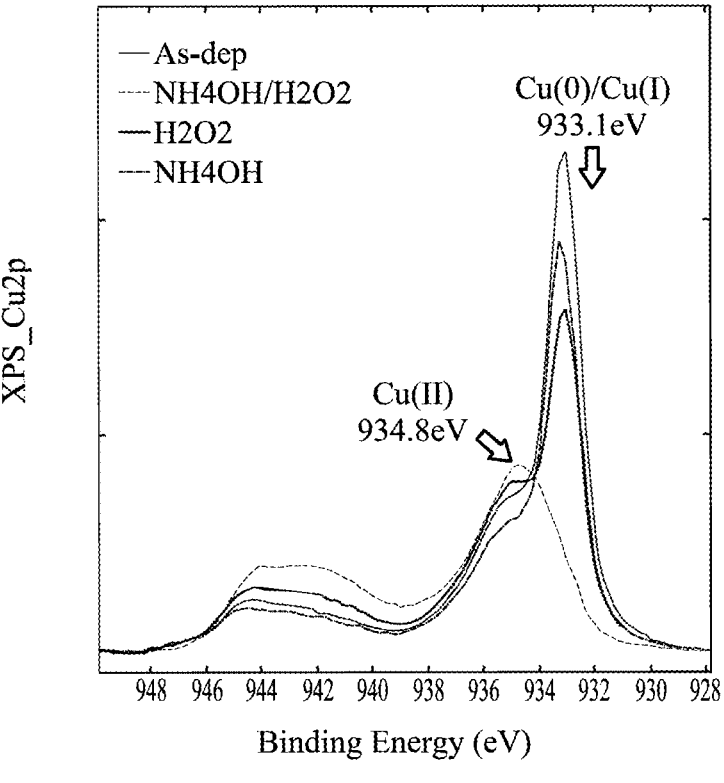
FIG. 13 shows XPS spectra for a Cu2p peak for an untreated copper surface as well for several treated copper surfaces.

FIG. 13 shows XPS spectra of a Cu2p peak for (a) an untreated copper surface: (b) a copper surface treated with an aqueous solution including a combination of $NH_4OH$ and $H_2O_2$; (c) a copper surface treated with an aqueous solution including $H_2O_2$ but not $NH_4OH$; and (d) a copper surface treated with an aqueous solution including $NH_4OH$ but not $H_2O$. The XPS spectra of the untreated copper surface has a prominent peak at about 933.1 eV, which corresponds to a mixture of the Cu(0) and Cu(I) oxidation states. A peak at about 934.8 eV, which corresponds to the Cu(II) oxidation state, is almost non-existent for the untreated copper surface. The XPS spectra for the copper surface treated with the aqueous solution including the combination of $NH_4OH$ and $H_2O_2$ shows a prominent peak at about 934.8 eV, which corresponds to the Cu(II) oxidation state, with a peak at about 933.1 eV being suppressed. The XPS spectra for the copper surface treated with an aqueous solution including $H_2O_2$ but not $NH_4OH$ or for the copper surface treated with an aqueous solution including $NH_4OH$ but not $H_2O$ show in comparison with the untreated surface some growth of a peak at about 934.8 eV and some suppression of a peak at about 933.1 eV but not to the extent observed for the copper surface treated with the aqueous solution including the combination of $NH_4OH$ and $H_2O_2$. The data in FIG. 13 shows that the aqueous solution including the combination of $NH_4OH$ and $H_2O_2$ may be more effective for modifying the oxidation state of copper prior to deposition of the blocking material.

Figure 16:
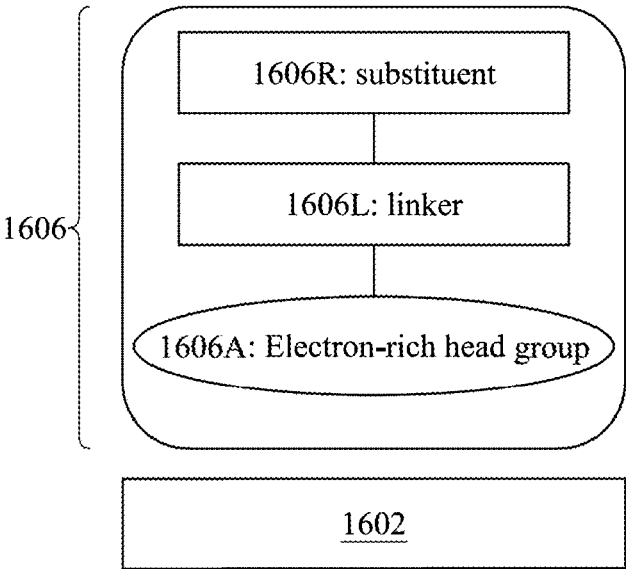
FIG. 16 illustrates a chemical structure of a blocking material molecule according to some embodiments.

FIG. 16 illustrates a chemical structure of a blocking material molecule 1606 which may be used for forming a blocking layer on a metal bottom surface 1602 of a trench.

A metal of metal bottom surface 1602, such as Cu or Co, is an electron acceptor. For bonding to electron accepting metal bottom surface 1602, blocking material molecule 1606 includes electron rich head group 1606A, which contains one or more electron rich atoms, such as O, N, S or P. For blocking deposition of a dielectric material on metal bottom surface 1602, blocking material molecule 1606 includes hydrophobic end group 1606R, which may end with a hydrocarbon group, such as CH, $CH_2$ or $CH_3$ group. Hydrophobic end group 1606R may be, for example, an aromatic group, an alkyl group or an alkyl substituted aromatic group. In some embodiments, electron rich head group 1606A may be bound directly to hydrophobic end group 1606R. Yet in some embodiments, electron rich head group 1606A may be linked to hydrophobic end group 1606R through a linker 1606L, which may be, for example, an alkyl linker and/or an aromatic linker.

Figure 17:
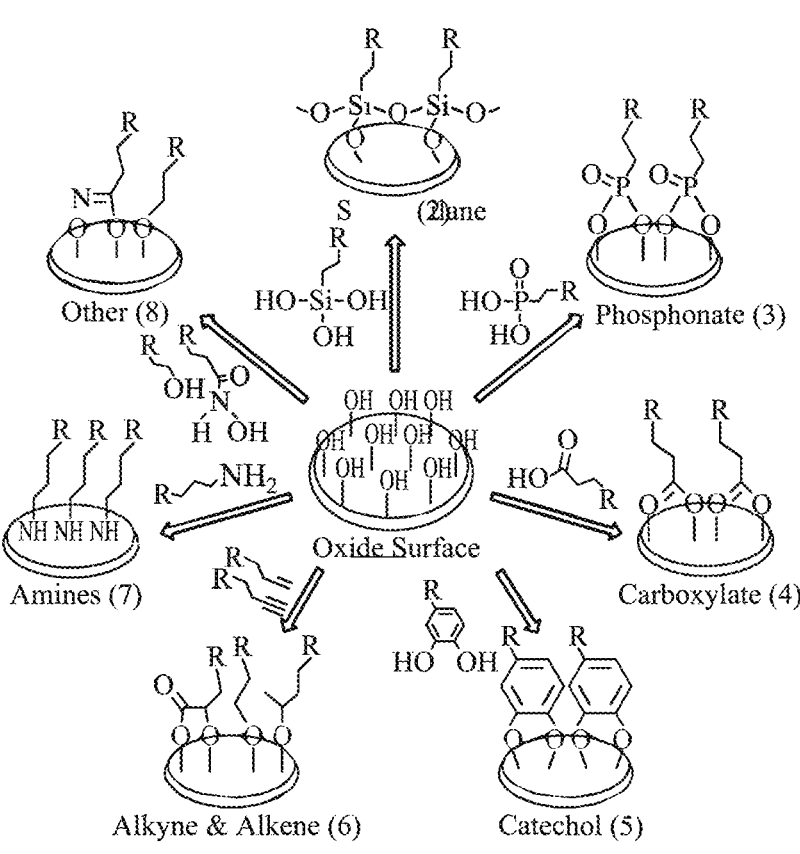
FIG. 17 illustrates exemplary classes of blocking materials.

FIG. 17 is reproduced from Angew. Chem. Ed., 2014, 53, 2-36. FIG. 17 illustrates a number of exemplary classes of blocking materials, which may be bound to hydroxyl groups on a metal bottom surface of a trench, such as surface 1602. These classes include (2) silanes with an electron rich silane head group containing Si and O linked to a hydrophobic end group R through, for example, an alkyl linker; (3) phosphonates with an electron rich group containing an electron rich phosphonate head group containing P and O linked to a hydrophobic end group R through, for example, an alkyl linker; (4) carboxylates with an electron rich carboxylate head group containing O linked to a hydrophobic end group R through, for example, an alkyl linker; (5) catechols with an electron rich head group containing O linked a hydrophobic group R through an aromatic linker; (6) alkynes and alkenes; (7) amines with an electron rich head group containing N linked a hydrophobic group R through, for example, an alkyl linker. The hydrophobic group R may be an alkyl or an aromatic group.

FIG. 18 illustrates exemplary nitrogen containing blocking materials.

The interconnect structure formed according to method 100 may be used in a BEOL (back-end-of-line) structure of a semiconductor device.

Figure 19:
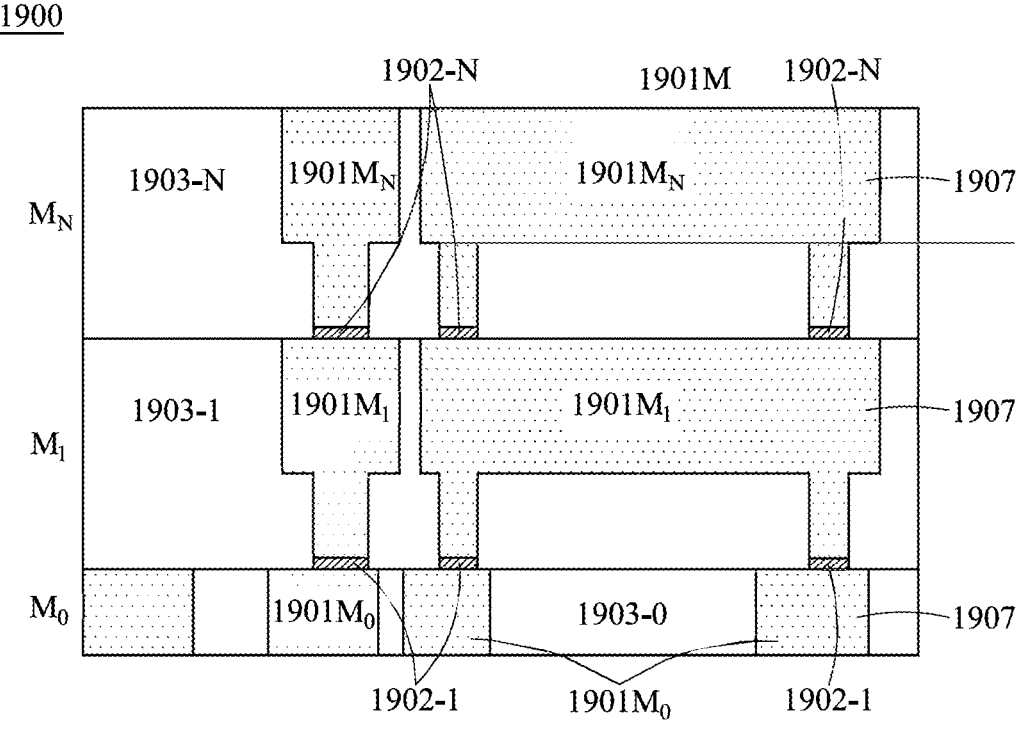
FIG. 19 illustrates a BEOL (back-end-of-line) structure according to one of embodiments.

FIG. 19 illustrates BEOL (back-end-of-line) structure 1900. BEOL structure 1900 includes transmission lines other interconnect structures that are implemented using a series of interconnected metallization structures, such as traces and conductive vias, 1901M which are formed within various alternating conductive and insulating/dielectric layers of BEOL structure 1900. Each metallization structure 1901M may include a plurality of metallization layers with layer $1901M_0$ being the closest to an active semiconductor layer of the semiconductor device with each subsequent layer, i.e. $1901M_1, \ldots 1901M_N$ being further from the active semiconductor layer of the semiconductor device. BEOL structure 1901 includes a plurality of insulating dielectric layers 1903: 1903-0, 1903-1 . . . 1903-N, with layer 1903-0 being the closest to the active semiconductor layer the semiconductor device. Metallization structures 1901 are formed penetrating dielectric layers 1903 of BEOL structure 1900. Metallization structures 1901 are surrounded by dielectric barrier or liner layer 1907, which may be a TaN layer.

A method, such as one of methods 100A-C, may be used while forming metallization layer, such as any metallization layer $1901M_1, \ldots 1901M_N$, in a respective dielectric layer, 1903-1 . . . 1903-N while being surrounded by a dielectric barrier or liner layer 1907, which may be a TaN layer, on its sides. For example, using metallization layer $1901M_1$ as an example, a trench may be formed in dielectric layer 1903-1. Side walls of such trench may be formed by a dielectric material of dielectric layer 1903-1, while a bottom surface 1902-1 of the trench will be formed by a portion of underlying metallization layer 1901$M_0$. The oxidation state of a metal, such as Cu, on the bottom surface of the trench, which may be a metal forming metallization layer 1901$M_0$, may be modified by, for example, applying an aqueous solution containing $NH_4OH$ and $H_2O_2$. Then a blocking material may be applied to bottom surface 1902-1. The blocking material may be subsequently baked at an elevated temperature such as at least 200 C or at least 220 C or at least 250 C or at least 275 C or at least 300 C or at least 310 C or at least 320 C or at least 330 C. The elevated temperature for baking may be from 200 C to 400 C or from 250 C to 400 C or from 300 C to 400 C or from 330 C to 400 C or any value or subrange within those ranges. Then a dielectric material, such as TaN, may be deposited for example, using ALD into the trench to form dielectric barrier or liner layer 1907. Because of the modification of oxidation state of the metal on the bottom surface 1902-1, an effective amount of the blocking material will remain after the baking to prevent deposition of the dielectric material, such as TaN, on bottom surface 1902-1. As such dielectric material is selectively deposited on the sidewalls of the trench. The absence or reduction of the dielectric material, such as TaN, on bottom surface 1902-1 will reduce resistance between metallization layer 1901$M_0$ and metallization layer 1901$M_1$, which will be formed by filling a trench with a metal, such as Cu, because a barrier between the two metallization layers will be reduced and/or eliminated. The process may repeated while forming metallization layers in subsequent dielectric layers. The modification of oxidation state of a bottom of a trench may allow eliminating the use of a capping layer, which may be formed of a less conductive metal, such as Co. As such, a direct contact between highly conductive metal, such as Cu, of two adjacent metallization layers, such as layers 1901$M_0$ and 1901$M_1$, may be formed, which may also reduce a resistance of a via or interconnect structure formed by multiple metallization layers, such as layers 1901$M_0$, 1901$M_1$, . . . 1901$M_N$.

FIGS. 14A-D and 15A-E illustrate steps of forming a blocking layer for subsequent depositing of a dielectric material, such as TaN, on a Co surface and on a Cu surface respectively.

Figure 14A:
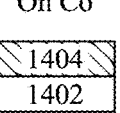
FIG. 14A-D illustrate steps of TaN deposition blocking in a method of forming an interconnect structure according to one of embodiments.

FIG. 14A shows Cu layer 1402 and capping Co layer 1404 over Cu layer 1402.

Figures 14B, 14C, 14D:
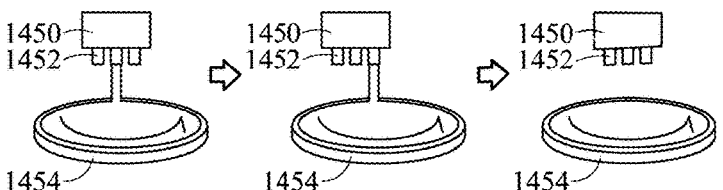

Layers 1402 and 1404 may be at a bottom of a trench, which may be used for forming an interconnect structure, such that a portion of Co layer 1404 forms a bottom surface of the trench. FIG. 14B shows deposition apparatus 1450, which includes multiple outlets 1452. Deposition apparatus 1450 includes handle 1454. Handle 1454 can hold multiple devices for which an interconnect structure to be formed. As such each of the multiple devices will have one or more trenches with a bottom surface of each trench formed by a capping Co layer, such as layer 1404, which over a Cu layer, such as layer 1402. Handle 1454 may rotate around a vertical axis to expose an individual device and/or an individual trench of the device to one of outlets 1452. In FIG. 14B, an active outlet of outlets 1452, to which an individual device and/or an individual trench of the device is exposed, is an outlet providing a coating solution to deposit a blocking material of the Co layer at the bottom of the trench. Thus, FIG. 14B illustrates wet coating of the blocking material. In FIG. 14C, an active outlet of outlets 1452, to which an individual device and/or an individual trench of the device is exposed, is an outlet providing a rinsing solution, which may be for example, water, to rinse the Co layer at the bottom of the trench with the deposited blocking material. FIG. 14D illustrates drying or baking of the blocking material deposited on the Co layer at the bottom of the trench. During the drying and the baking there is no exposure an individual device and/or an individual trench of the device to any of outlets 1452.

Figures 15A, 15B, 15C, 15D, 15E:
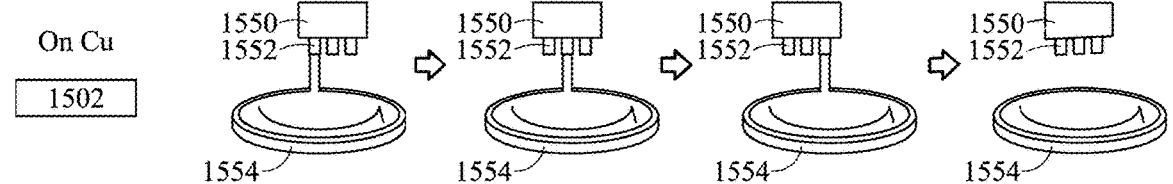
FIG. 15A-E illustrate steps of TaN deposition blocking in a method of forming an interconnect structure according to one of embodiments.

FIG. 15A shows Cu layer 1502, which may be at a bottom of a trench, which may be used for forming an interconnect structure, such that a portion of Cu layer 1502 forms a bottom surface of the trench. FIG. 15B shows deposition apparatus 1550, which includes multiple outlets 1552. Deposition apparatus 1550 includes handle 1554. Handle 1554 can hold multiple devices for which an interconnect structure to be formed. As such each of the multiple devices will have one or more trenches with a bottom surface of each trench formed by a Cu layer, such as layer 1502. Handle 1554 may rotate around a vertical axis to expose an individual device and/or an individual trench of the device to one of outlets 1552. In FIG. 15B, an active outlet of outlets 1552, to which an individual device and/or an individual trench of the device is exposed, is an outlet providing a aqueous solution comprising $NH_4OH$ and $H_2O_2$ in order to modify an oxidation state of copper at the bottom of the trench. Thus, FIG. 15B illustrates pre-treatment of the Cu layer in order to modify its oxidation state, which may allow stabilizing of a blocking material on the Cu layer. In FIG. 15C, an active outlet of outlets 1552, to which an individual device and/or an individual trench of the device is exposed, is an outlet providing a coating solution to deposit a blocking material of the Cu layer at the bottom of the trench. Thus, FIG. 15C illustrates wet coating of the blocking material. In FIG. 15D, an active outlet of outlets 1552, to which an individual device and/or an individual trench of the device is exposed, is an outlet providing a rinsing solution, which may be for example, water, to rinse the Cu layer at the bottom of the trench with the deposited blocking material. FIG. 15E illustrates drying or baking of the blocking material deposited on the Cu layer at the bottom of the trench. During the drying and the baking there is no exposure an individual device and/or an individual trench of the device to any of outlets 1552. Overall deposition apparatus 1550 for depositing a blocking material on a Cu layer may be the same deposition apparatus 1450 for depositing a blocking material on a Co layer as long it has an outlet providing a aqueous solution comprising $NH_4OH$ and $H_2O_2$ in order to modify an oxidation state of copper.

In one aspect of the present disclosure, an interconnect structure, which may be used for example in a semiconductor device, is disclosed. The interconnect structure includes a contact layer made of a metal; one or more dielectric layers on the contact layer, and a deposited layer made of an insulating material. The interconnect structure further includes a trench through the one or more dielectric layers so that a sidewall surface of the trench is formed by the one or more dielectric layers and a bottom surface of the trench is formed by a portion of the contact layer. The deposited layer is in the trench and a thickness of the insulating material on the sidewall surface of the trench is at least 2.1 times greater than a thickness of the insulating material on the bottom surface of the trench.

In another aspect of the present disclosure, a method of forming an interconnect structure is disclosed. The method includes forming a trench through one or more dielectric layers, which are on a contact layer made of a metal, so that a sidewall surface of the trench is formed by the one or more dielectric layers and a bottom surface of the trench is formed by a portion of the contact layer. The method further includes modifying an oxidation state of the metal; then forming a blocking layer on the bottom surface of the trench; and depositing a layer of an insulating material in the trench.

In yet another aspect of the present disclosure, a method of selective deposition is disclosed. The method includes modifying an oxidation state of a metal on a bottom surface of a trench, the trench having a dielectric side surface; then forming a blocking layer on the bottom surface of the trench; and depositing a layer of an insulating material in the trench, so that a thickness of the insulating material on the sidewall surface of the trench is at least 2.1 times greater than a thickness of the insulating material on the bottom surface of the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an interconnect structure, comprising:

forming a trench through one or more dielectric layers, which are on a contact layer made of a metal, so that a sidewall surface of the trench is formed by the one or more dielectric layers and a bottom surface of the trench is formed by a portion of the contact layer, the bottom surface of the formed trench has the metal in a first oxidation state;

oxidizing the metal on the bottom surface of the trench so that after the oxidizing, the metal on the bottom surface of the trench is in a second oxidation state, which is a more oxidized state than the first oxidation state;

then forming a blocking layer comprising blocking molecules each comprising (a) a hydrophobic end group, (b) an electron rich head group and (c) a linker between the hydrophobic end group and the electron rich head group on the metal in the second oxidation state on the bottom surface of the trench, wherein the formed blocking layer formed on the metal in the second oxidation state is more stable than an otherwise identical blocking layer formed on the metal in the first oxidation state; and depositing a layer of an insulating material in the trench, wherein a thickness of the deposited insulating material on the sidewall surface of the trench is greater than a thickness of the deposited insulating material on the bottom surface of the trench.

2. The method of claim 1, wherein the one or more dielectric layers comprise an etch stopping layer on the contact layer and the forming the trench comprises etching the one or more dielectric layers.

3. The method of claim 1, wherein the metal is Cu or Mo.

4. The method of claim 1, wherein said oxidizing comprises exposing the bottom surface of the trench to a solution comprising $NH_4OH$ and $H_2O_2$, wherein said exposing changes an oxidation state of the metal on the bottom surface of the trench from the first oxidation state to the second oxidation state.

5. The method of claim 1, further comprising baking the formed blocking layer at a temperature of at least 250 C.

6. The method of claim 1, wherein an insulating material is TaN.

7. The method of claim 6, wherein said depositing is performed by atomic layer deposition.

8. The method of claim 7, wherein the thickness of the deposited insulating material on the sidewall surface of the trench is at least 2.1 times greater than the thickness of the deposited insulating material on the bottom surface of the trench.

9. The method of claim 7, wherein the thickness of the deposited insulating material on the sidewall surface of the trench is at least 2.5 times greater than the thickness of the deposited insulating material on the bottom surface of the trench.

10. The method of claim 1, wherein said depositing is performed by atomic layer deposition.

11. The method of claim 1, wherein a thickness of the deposited insulating material on the sidewall surface of the trench is at least 2.1 times greater than a thickness of the deposited insulating material on the bottom surface of the trench.

12. The method of claim 1, wherein the metal is Cu, wherein the first oxidation state comprises at least one of Cu(0) and Cu(I) and the second oxidation state is Cu(II).

13. The method of claim 12, wherein the thickness of the deposited insulating material on the sidewall surface of the trench is at least 2.1 times greater than the thickness of the deposited insulating material on the bottom surface of the trench.

14. The method of claim 12, wherein the thickness of the deposited insulating material on the sidewall surface of the trench is at least 2.5 times greater than the thickness of the deposited insulating material on the bottom surface of the trench.

15. The method of claim 1, wherein the metal is Mo.

16. The method of claim 15, wherein the thickness of the deposited insulating material on the sidewall surface of the trench is at least 2.1 times greater than the thickness of the deposited insulating material on the bottom surface of the trench.

17. The method of claim 15, wherein the thickness of the deposited insulating material on the sidewall surface of the trench is at least 2.5 times greater than the thickness of the deposited insulating material on the bottom surface of the trench.

18. The method of claim 1, wherein the thickness of the deposited insulating material on the sidewall surface of the trench is at least 2.5 times greater than the thickness of the deposited insulating material on the bottom surface of the trench.

19. A method of forming an interconnect structure, comprising:

forming a trench through one or more dielectric layers, which are on a contact layer made of copper, so that a sidewall surface of the trench is formed by the one or more dielectric layers and a bottom surface of the trench is formed by a portion of the contact layer, wherein the copper on the bottom surface of the trench is a first oxidation state comprising at least of Cu(0) and Cu(I);

chemically changing an oxidation state of the copper on the bottom surface of the trench from the first oxidation state to a second oxidation state, which is Cu(II), then forming a blocking layer comprising blocking molecules each comprising (a) a hydrophobic end group, (b) an electron rich head group and (c) a linker between the hydrophobic end group and the electron rich head group on the copper in the second oxidation state on the bottom surface of the trench; and depositing by atomic layer deposition a layer of TaN in the trench, wherein a thickness of the deposited insulating material on the sidewall surface of the trench is greater than a thickness of the deposited insulating material on the bottom surface of the trench.

20. A method of forming an interconnect structure, comprising:

forming a trench through one or more dielectric layers, which are on a contact layer made of a metal, so that a sidewall surface of the trench is formed by the one or more dielectric layers and a bottom surface of the trench is formed by a portion of the contact layer, the bottom surface of the formed trench has the metal in a first oxidation state;

chemically changing an oxidation state of the metal on the bottom surface of the trench from a first oxidation state to a second oxidation state, which is a more oxidized state than the first oxidation state;

then forming a blocking layer comprising blocking molecules each comprising (a) a hydrophobic end group, (b) an electron rich head group and (c) a linker between the hydrophobic end group and the electron rich head group on the metal in the second oxidation state on the bottom surface of the trench, wherein the formed blocking layer formed on the metal in the second oxidation state is more stable than an otherwise identical blocking layer formed on the metal in the first oxidation state; and depositing a layer of an insulating material in the trench, wherein a thickness of the deposited insulating material on the sidewall surface of the trench is greater than a thickness of the deposited insulating material on the bottom surface of the trench.

* * * * *